(12) United States Patent
Dunklee

(10) Patent No.: US 6,965,226 B2
(45) Date of Patent: Nov. 15, 2005

(54) CHUCK FOR HOLDING A DEVICE UNDER TEST

(75) Inventor: John Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 393 days.

(21) Appl. No.: 09/877,823

(22) Filed: Jun. 7, 2001

(65) Prior Publication Data

US 2002/0027433 A1   Mar. 7, 2002

Related U.S. Application Data

(60) Provisional application No. 60/230,212, filed on Sep. 5, 2000.

(51) Int. Cl.[7] .............................................. G01R 31/02
(52) U.S. Cl. .................... 324/158.1; 324/754
(58) Field of Search .............................. 324/758, 754, 324/765, 158.1

(56) References Cited

U.S. PATENT DOCUMENTS

| | | | |
|---|---|---|---|
| 5,091,691 A * | 2/1992 | Kamieniecki et al. | 324/765 |
| 5,410,259 A * | 4/1995 | Fujihara et al. | 324/758 |
| 6,320,372 B1 * | 11/2001 | Keller | 324/158.1 |

* cited by examiner

*Primary Examiner*—Ernest Karlsen
(74) *Attorney, Agent, or Firm*—Chernoff, Vilhauer, McClung & Stenzel

(57) ABSTRACT

A chuck for a probe station that include a first chuck assembly element defining a substantially planar upper and lower surfaces, and another chuck assembly element defining a substantially planar surface. The chuck includes a spacing mechanism having exactly three independent supports interconnecting the first chuck assembly element and the another chuck assembly element defining the spacing between the first chuck assembly element and the another chuck assembly element in such a manner that the substantially planar lower surface of the first chuck assembly element and the substantially planar upper surface of the another chuck assembly element are in opposing relationship with respect to one another.

17 Claims, 12 Drawing Sheets

CHUCK FOR HOLDING A DEVICE UNDER TEST

This application claims the benefit of U.S. patent application Ser. No. 60/230,212 filed Sep. 5, 2000.

BACKGROUND OF THE INVENTION

The present application relates to an improved chuck.

With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the, lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18 a transversely along the X and Y axes until the edge of the top plate 72 abuts against the margin 74b of the plate 74. The size of the aperture 74*a* is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74*b* results in the sliding of the plate 74 toward the peripheral margin 76*b* of the next underlying plate 76. Again, the central aperture 76*a* in the plate 76 is large enough to permit abutment of the plate 74 with the margin 76*b*, but small enough to prevent the plate 74 from uncovering the aperture 76*a*, thereby likewise maintaining the seal between the plates 74 and 76. Still further movement of the plunger 18 and bearing housing in the same direction causes similar sliding of the plates 76 and 78 relative to their underlying plates into abutment with the margin 78*b* and the side of the box portion 44, respectively, without the apertures 78*a* and 79*a* becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90*a*, 90*b*, 90*c* (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108*a*, 108*b* and 110*a*, 10*b*, respectively, electrically insulated from each other, with the connector elements 108*b* and 110*b* preferably coaxially surrounding the connector elements 108*a* and 10*a* as guards therefor. If desired, the connector assemblies 108 and 110 can be triaxial in configuration so as to include respective outer shields 108*c*, 110*c* surrounding the respective connector elements 108*b* and 110*b*, as shown in FIG. 7. The outer shields 108*c* and 110*c* may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108*a* and 110*a* are electrically connected in parallel to a connector plate 114 matingly and detachably connected along a curved contact surface 114*a* by screws 114*b* and 114*c* to the curved edge of the chuck assembly element 80. Conversely, the connector elements 108*b* and 110*b* are connected in parallel to a connector plate 116 similarly matingly connected detachably to element 81. The connector elements pass freely through a rectangular opening 112*a* in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 5284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

The chuck assembly 20 with corresponding vertical apertures 84 and respective chambers separated by O-rings 88 permits selectively creating a vacuum within three different zones. Including the three O-rings 88 and the dielectric spacers 85 surrounding the metallic screws 96 permits securing adjacent first, second and third chuck assembly elements 80, 81 and 83 together. The concentric O-rings 88 are squeezed by the first and second chuck assembly elements and assist in distributing the force across the upper surface of the chuck assembly 20 to maintain a flat surface. However, the O-rings and dielectric spacers 85 have a greater dielectric constant than the-surrounding air resulting in leakage currents. Also, the additional material between adjoining chuck assembly elements 80, 81, and 83 decreases the capacitance between the adjoining chuck assembly elements. Moreover, the dielectric material of the O-rings and dielectric spacers 85 builds up a charge therein during testing which increases the dielectric absorption. The O-rings and dielectric spacers 85 provides mechanical stability against warping the chuck when a wafer thereon is probed so that thinner chuck assembly elements 80, 81, and 83 may be used. The height of the different O-rings and dielectric spacers 85 tend to be slightly different which introduces non-planarity in the upper surface when the first, second, and third chuck assembly elements 80, 81, and 83 are secured together.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2A is a partial top view of the wafer probe station of FIG. 1 with the enclosure door shown partially open.

FIG. 3A is an enlarged sectional view taken along line 3A—3A of FIG. 3.

DETAILED DESCRIPTION OF THE PREFERRED EMBODIMENT

Traditionally chuck designers use thin chuck assembly elements and many radially arranged screws in order to permit the screws to be tightened tightly without significantly warping any of the chuck assembly elements, and in particular the upper chuck assembly element. Maintaining a flat planar upper chuck assembly element is important to permit accurate probing of the wafer and avoid breaking, or otherwise damaging, the wafer while probing. In a multi-layered chuck, the lower chuck assembly element is secured to the middle chuck assembly element, the middle-chuck assembly element in turn is secured to the upper chuck assembly element, which results in any non-uniformities of slightly different thicknesses of the chuck assembly elements and interposed dielectric elements creating a cumulative non-planarity. For example, non-uniformity in the planarity of the lower chuck assembly element and differences in the thickness of the dielectric spacers may result in the middle chuck assembly element being slightly warped when secured thereto. Non-uniformity in the planarity of the middle chuck assembly element, the slight warping of the middle chuck assembly element, and the differences in the thickness of the dielectric spacers and O-rings, may result significant warping of the upper chuck assembly element when secured to the middle chuck assembly element. Accordingly, the thicknesses and planarity of (1) each chuck assembly element, (2) dielectric spacers, and (3) O-rings, needs to be accurately controlled in order to achieve a planar upper surface of the upper chuck assembly element.

Figure 1:
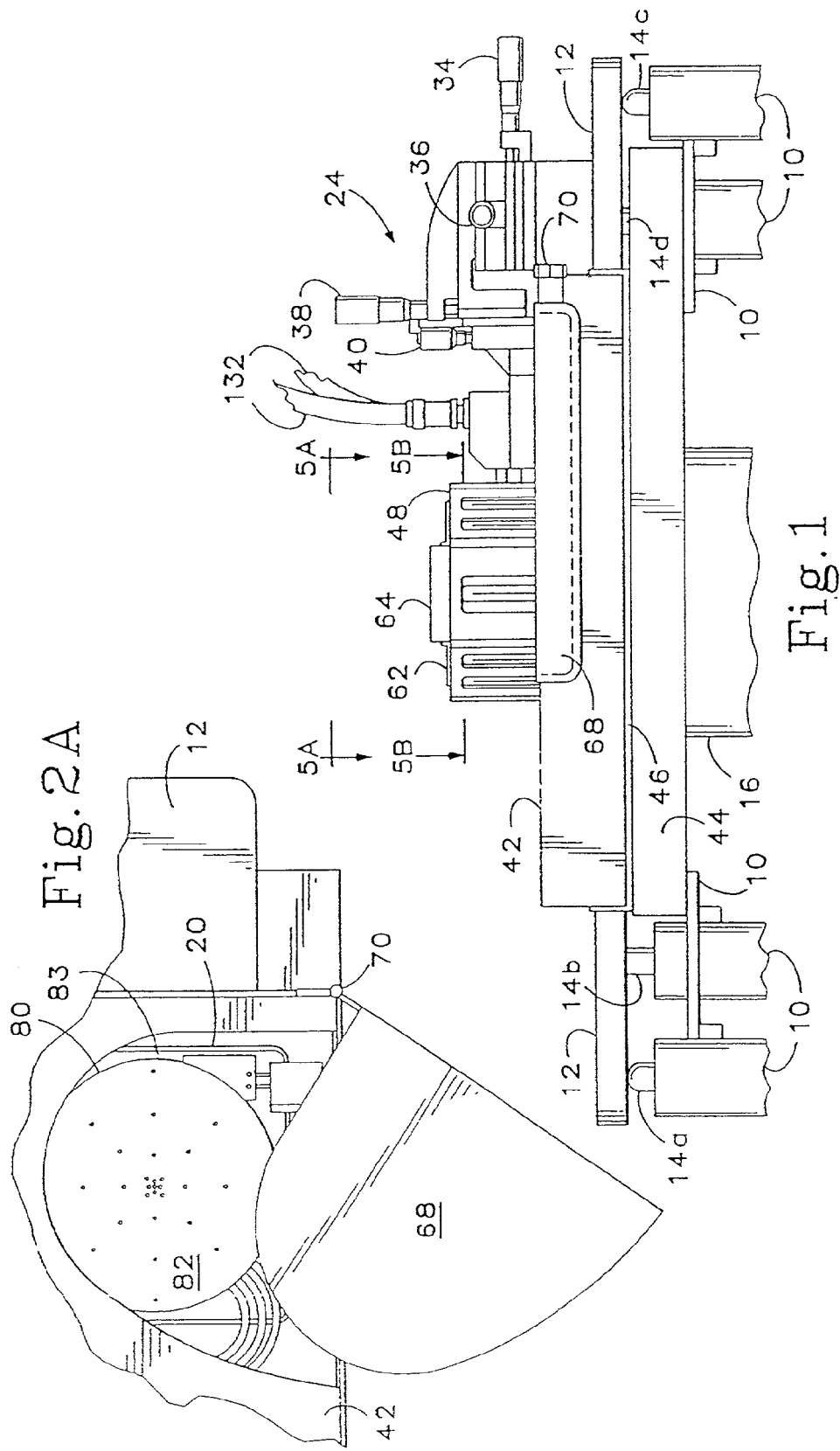
FIG. 1 is a partial front view of an exemplary embodiment of a wafer probe station constructed in accordance with the present invention.
Figure 2:
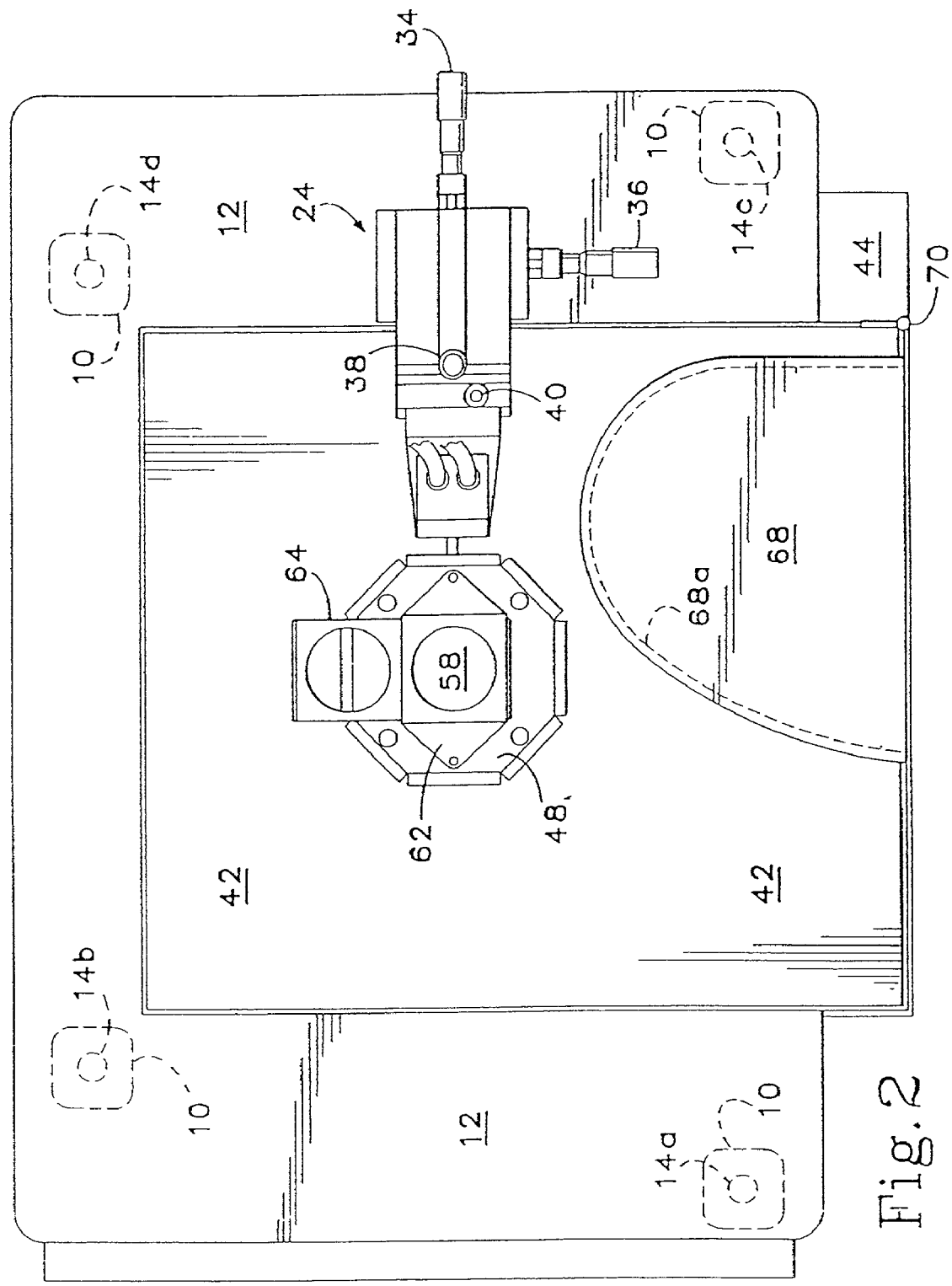
FIG. 2 is a top view of the wafer probe station of FIG. 1.
Figure 3:
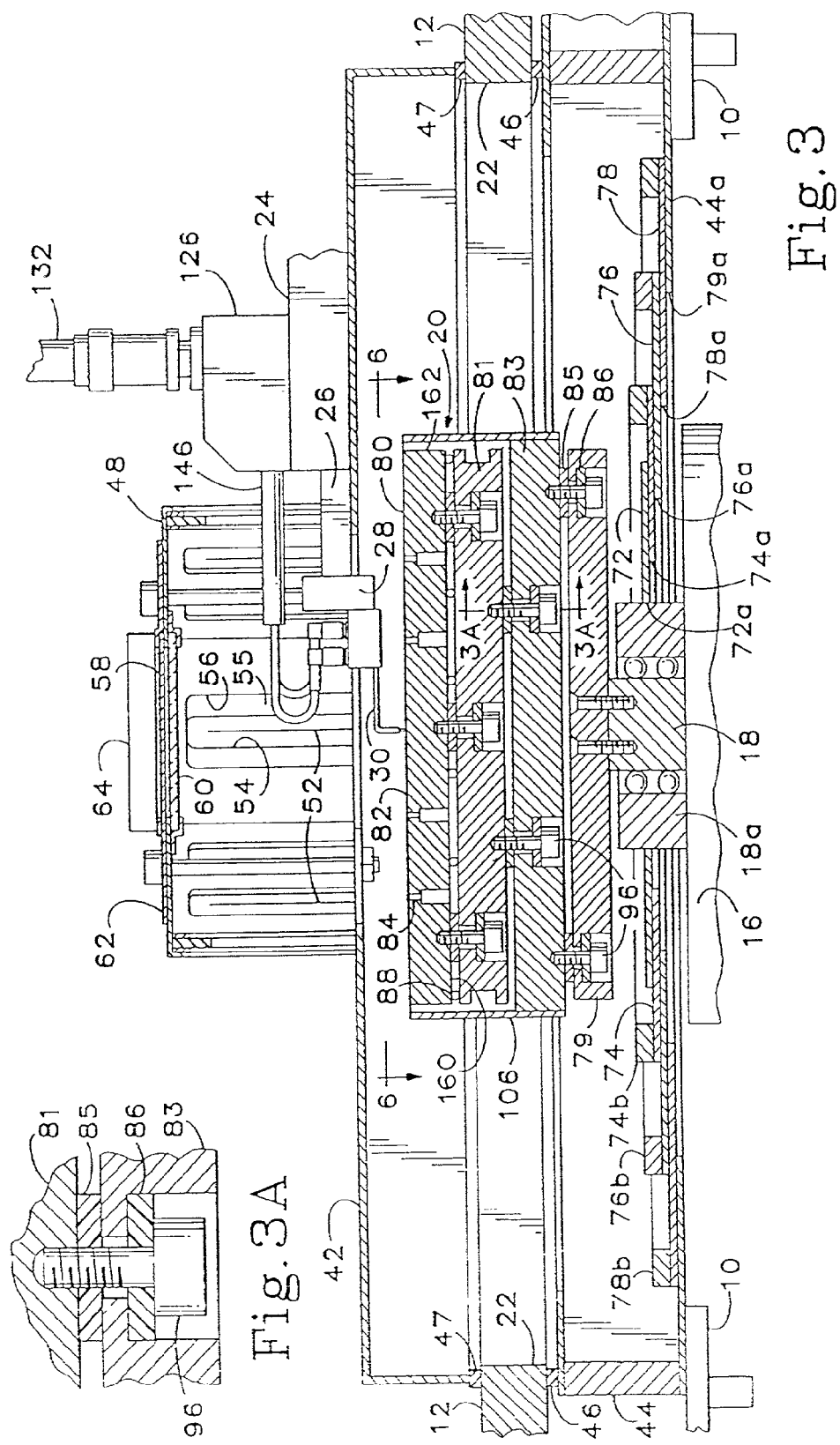
FIG. 3 is a partially sectional and partially schematic front view of the probe station of FIG. 1.
Figure 4:
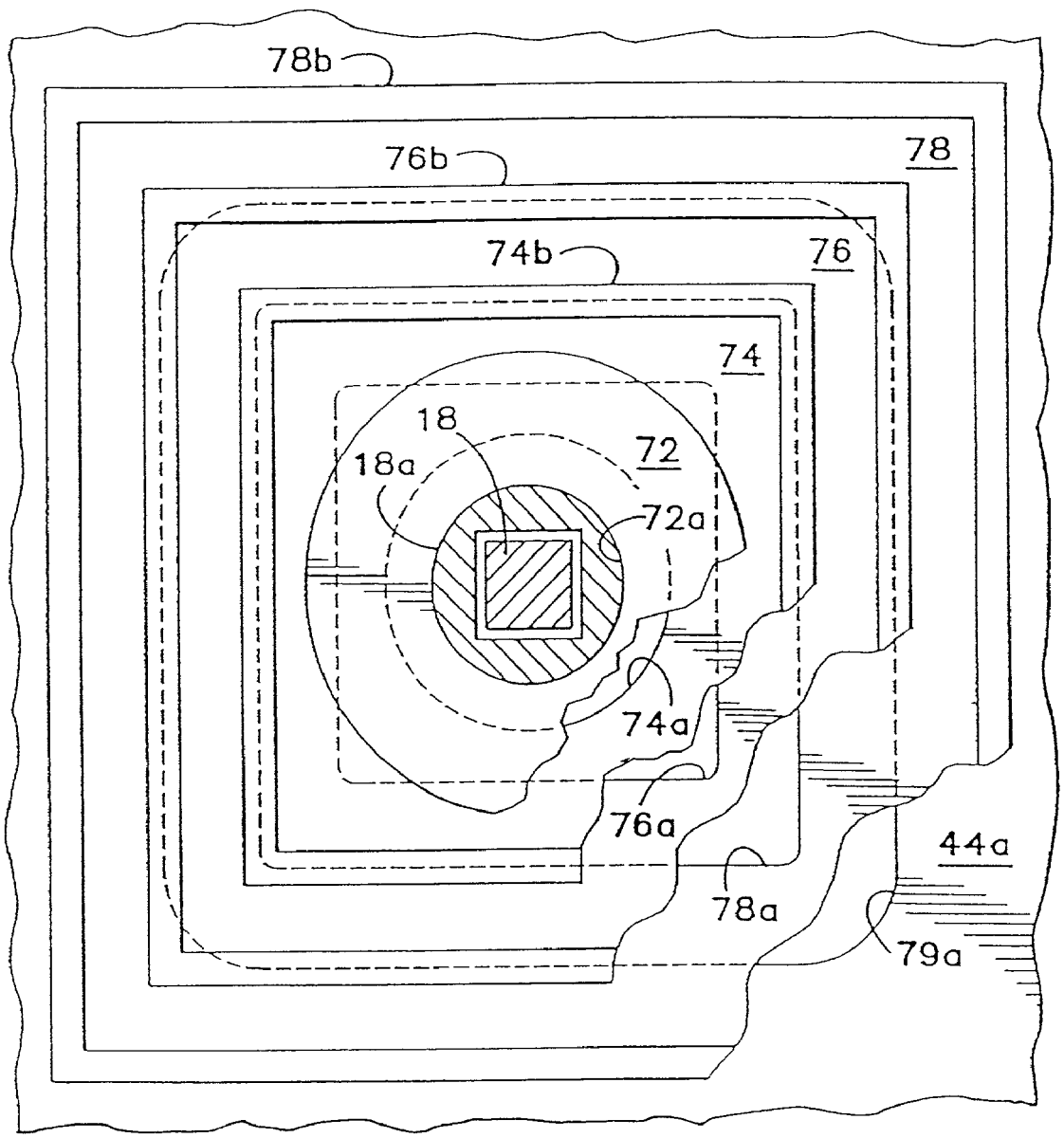
FIG. 4 is a top view of the sealing assembly where the motorized positioning mechanism extends through the bottom of the enclosure.
Figure 5A:
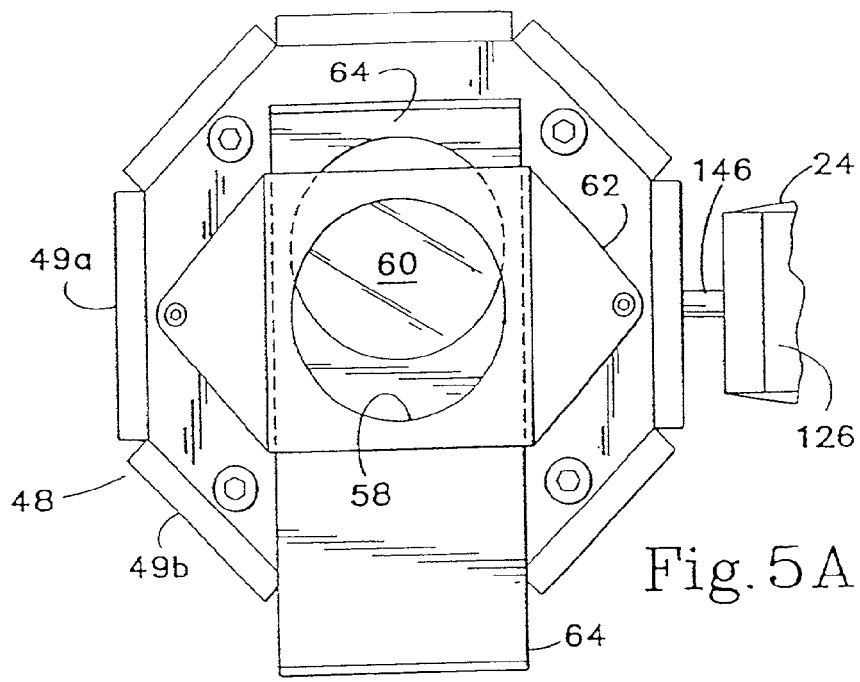
FIG. 5A is an enlarged top detail view taken along line 5A—5A of FIG. 1.
Figure 5B:
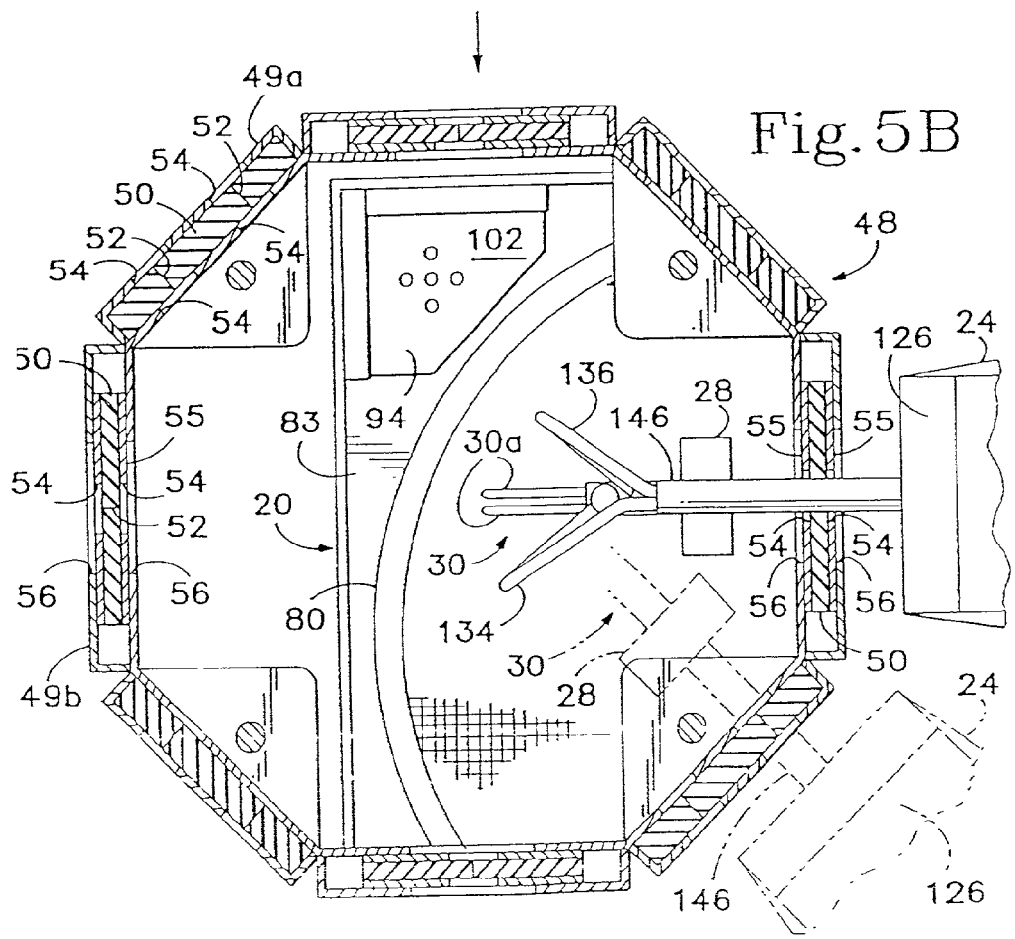
FIG. 5B is an enlarged top sectional view taken along line 5B-5B of FIG. 1.
Figure 6:
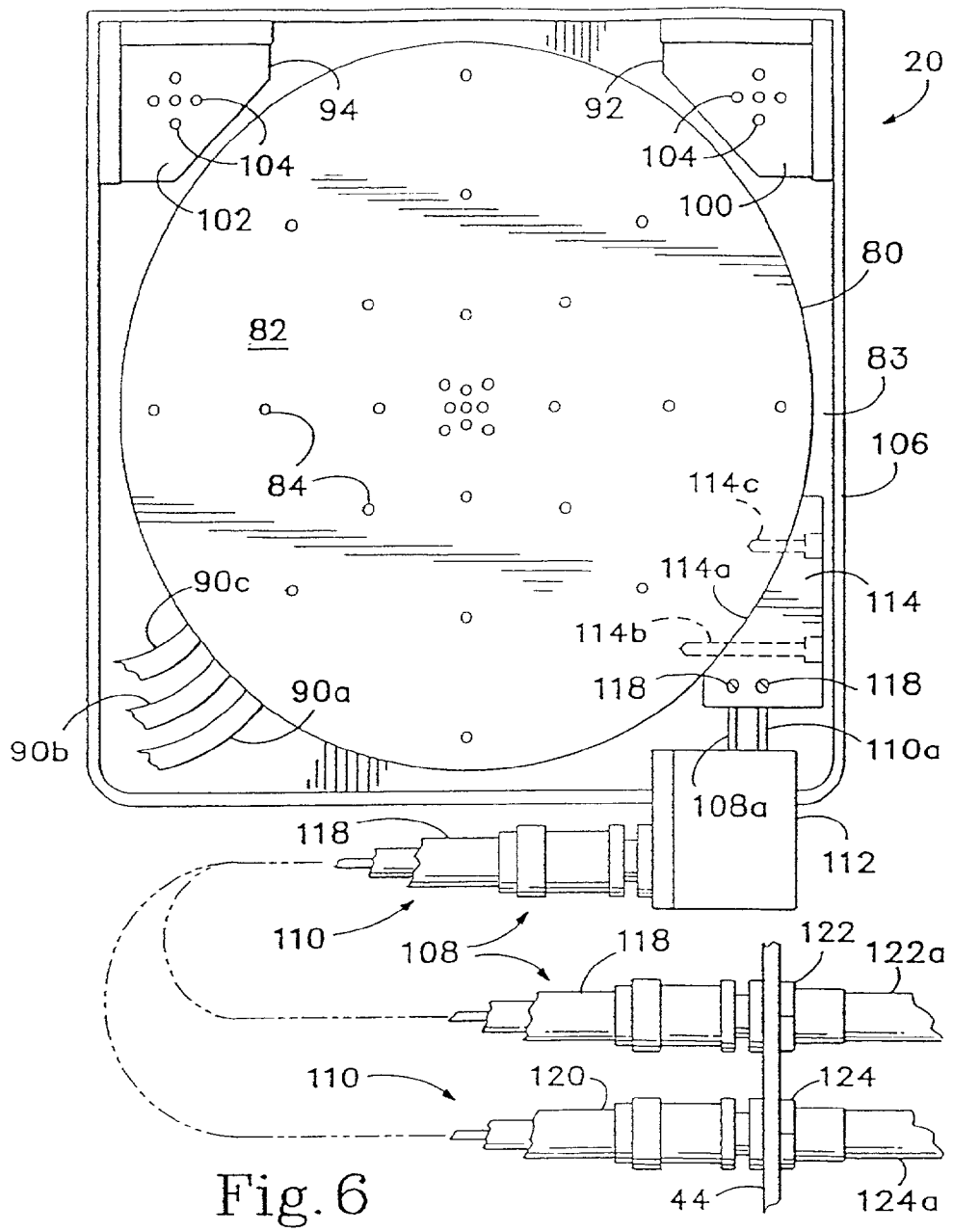
FIG. 6 is a partially schematic top detail view of the chuck assembly, taken along line 6—6 of FIG. 3.
Figure 7:
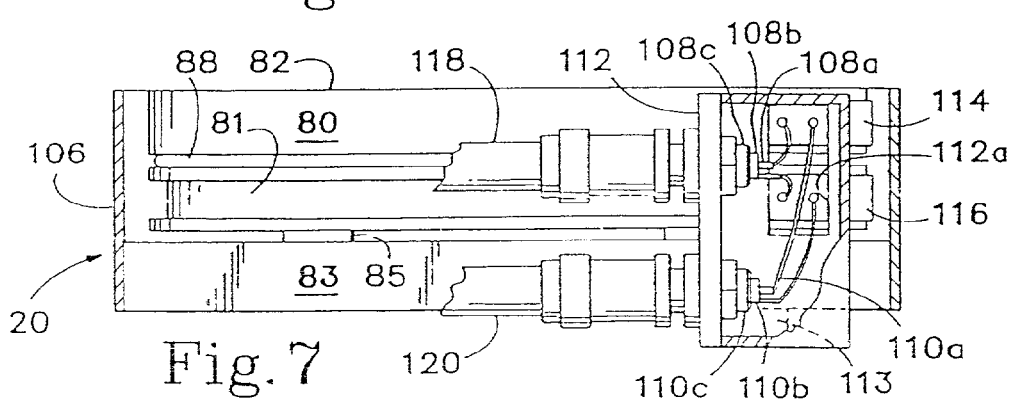
FIG. 7 is a partially sectional front view of the chuck assembly of FIG. 6.
Figure 8:
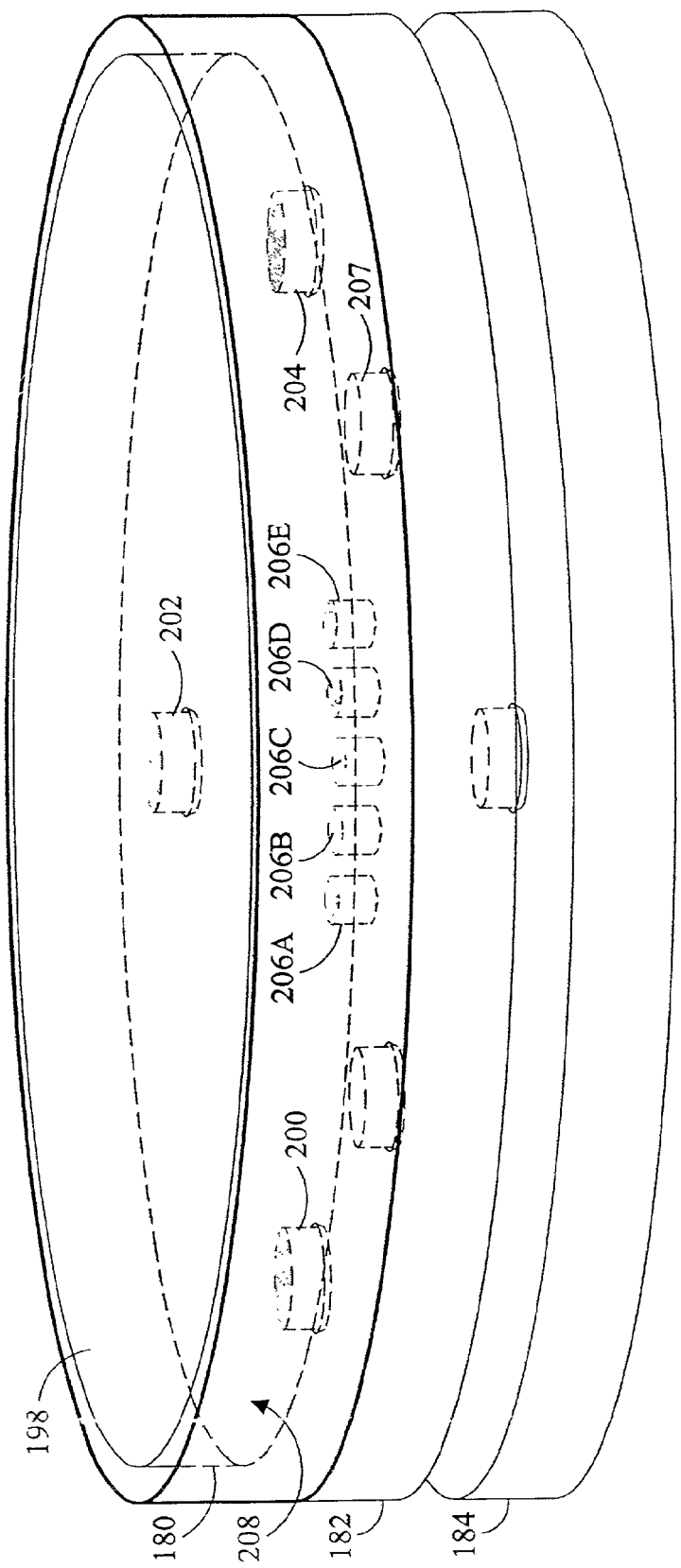
FIG. 8 is a perspective view of a chuck illustrating a set of spacers and vacuum interconnections.

After consideration of the thin chuck assembly elements and the desire to minimize warping of the upper chuck assembly element, the present inventor came to the realization that a three point securement system, including for example three pins, permits defining the orientation of the upper chuck assembly element without inducing stress into the upper chuck assembly element 180, as illustrated in FIG. 8. Preferably, the pins are substantially equal distant from one another. Changes in the spacing of the height of any of the pins 200, 202, 204 results in pivoting the upper chuck assembly element 180 about the remaining two pins in a manner free from introducing added stress and hence non-planarity of the upper surface 198 of the upper chuck assembly element. There are preferably no dielectric spacers which maintain, or otherwise define, the spacing between the upper and middle chuck assembly elements, other-than the pins 200, 202, 204. The elimination of dielectric spacers, such as O-rings, avoids stressing the upper chuck assembly element when under pressing engagement with the middle chuck assembly element. Another benefit that may be achieved by using a three point system is that the orientation of the upper surface of the upper chuck assembly element may be defined with respect to the prober stage and probes with minimal, if any, planarization of the intervening layers. In other words, if the planarity of the middle and lower chuck assembly elements is not accurately controlled, the planarity of the upper chuck assembly element will not be affected. Normally the spacing between the upper/middle and middle/lower chuck assembly elements is relatively uniform to provide relatively uniform capacitance between the respective chuck assembly elements. It is to be understood that any suitable interconnection assembly involving three discrete points or regions of the chuck assembly elements may be employed.

Minimization of the spacers, such as O-rings, between the upper and middle chuck assembly elements reduces the capacitive coupling between the upper and middle chuck assembly elements to less than it would have been with additional dielectric layer material there between. The elimination of additional spacers likewise increases the resistance between adjacent chuck assembly elements.

Connecting each vacuum line(s) directly to the center of the upper chuck assembly element 180 normally requires at least one corresponding hole drilled radially into the upper chuck assembly element from which vertically extending vacuum chambers provide a vacuum to the upper surface 198 of the upper chuck assembly element. Machining the combination of radial and vertical holes requires highly accurate machining which is difficult, time consuming, and expensive. Machining such holes becomes increasingly more difficult as the size of the chucks increases.

Figure 9:
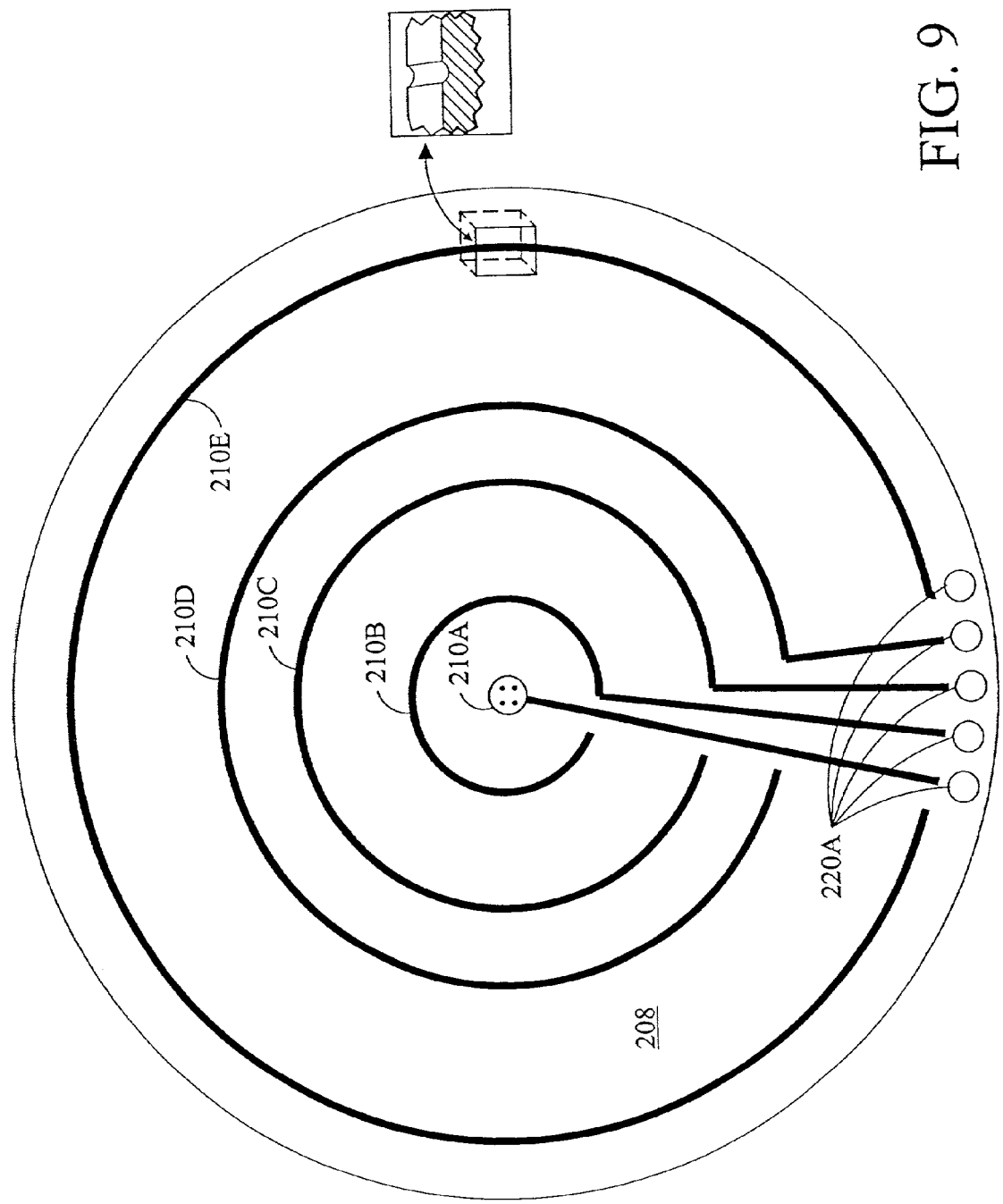
FIG. 9 is a plan view of the bottom surface of the upper chuck assembly element.
Figure 10:
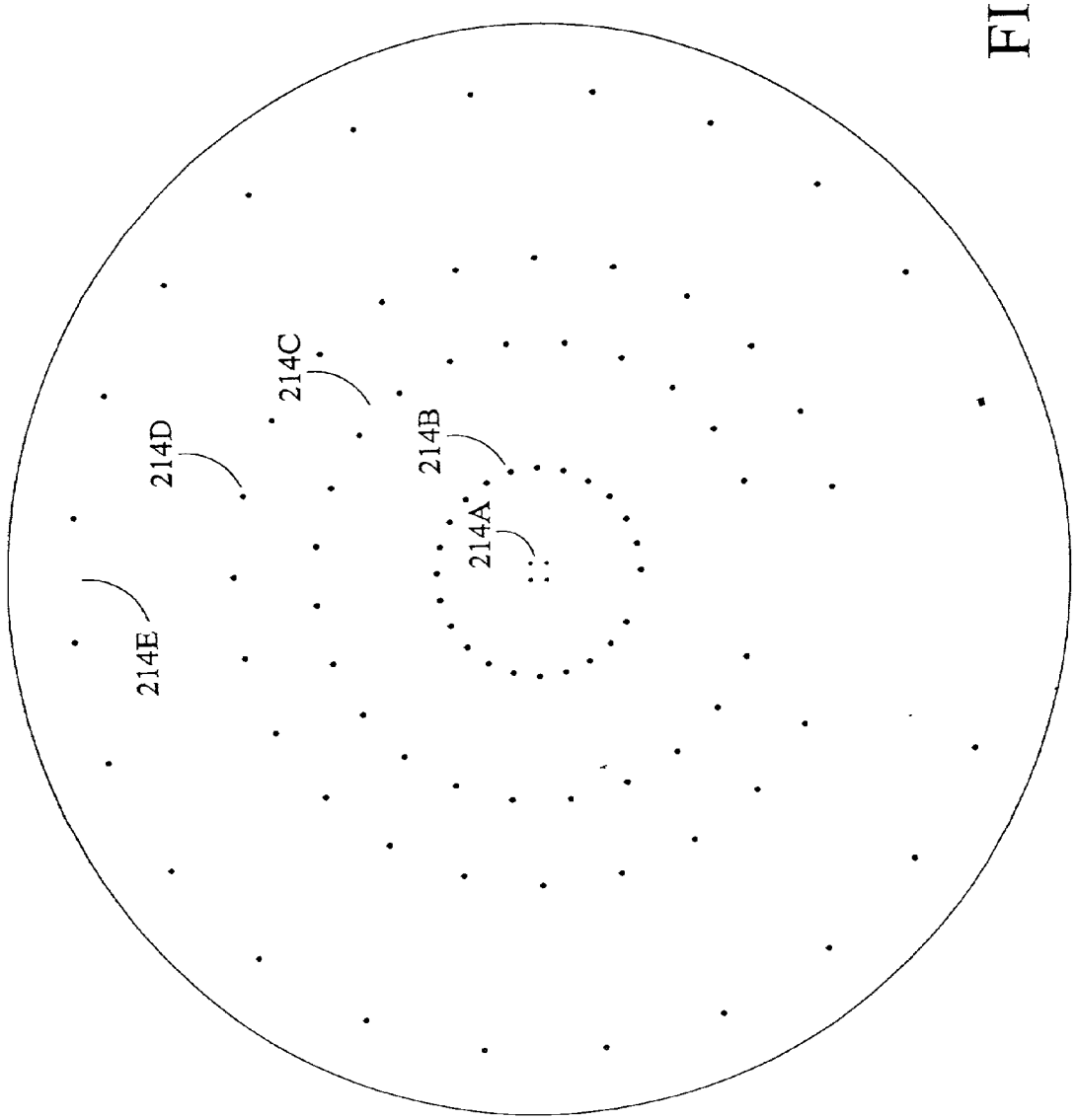
FIG. 10 is a plan view of the upper surface of the upper chuck assembly element.

After consideration of the difficulty of machining accurate holes into the side of the upper chuck assembly element 180, the present inventor determined that machining a set of airways 210a–210e in the lower surface 208 of the upper chuck assembly element is easier and tends to be more accurate, as shown in FIG. 9. In addition, the airways 210a–210e in the lower surface 208 of the chuck may be readily cleaned of dust and debris. The lower surface 208 of the upper chuck assembly element is covered with a cover plate 212 (see FIG. 11), which is preferably thin. The cover plate 212 is preferably secured to the upper chuck assembly with glue (not shown) and a thin layer of vacuum grease to provide a seal there between. Preferably, the cover plate 212 is conductive material electrically connected to the upper chuck assembly element. It is to be understood that the cover plate may be made of any material having any thickness, as desired. Referring to FIG. 10, a plurality of "zones" defined by vacuum holes 214a–214e to the upper surface 198 may be achieved, each of which is preferably concentric in nature, so that each "zone" may be individually controlled and provided a vacuum, if desired. This provides accurate pressure control for different sizes of wafers. For example, the diameters of the concentric rings may be, 2½", 5½", 7½", and 11½" to accommodate wafers having sizes of 3", 6", 8", and 12". This permits the system to be selectively controlled to accommodate the size of the wafer being tested so that uncovered vacuum holes are not attempting to provide a vacuum, which may reduce the vacuum pressure available and pull contaminated air through the system. Dust and other debris in contaminated air may result in a thin layer of dust within the vacuum interconnections, described later, resulting in a decrease in electrical isolation between the upper and middle chuck assembly elements. It is to be understood that any suitable structure may be used to define a series of airways between adjacent layers of material, such materials preferably being conductive and in face-to-face engagement. The definition of airways may even be used with chucks where the vacuum lines are interconnected to the upper chuck assembly element, together with the definition of airway.

The elimination of the O-rings between the adjacent upper and middle chuck assembly elements creates a dilemma as to of how to provide a vacuum to the top surface of the upper chuck assembly element, if desired. The present inventor determined that it is normally undesirable to attach a vacuum tube directly to the upper chuck assembly element because the exterior conductive surface of the vacuum tube is normally connected to shield potential. The shield potential of the exterior of the vacuum tube directly adjoining the upper chuck assembly element would result in an unguarded leakage current between the upper chuck assembly and the vacuum tube.

Figure 11:
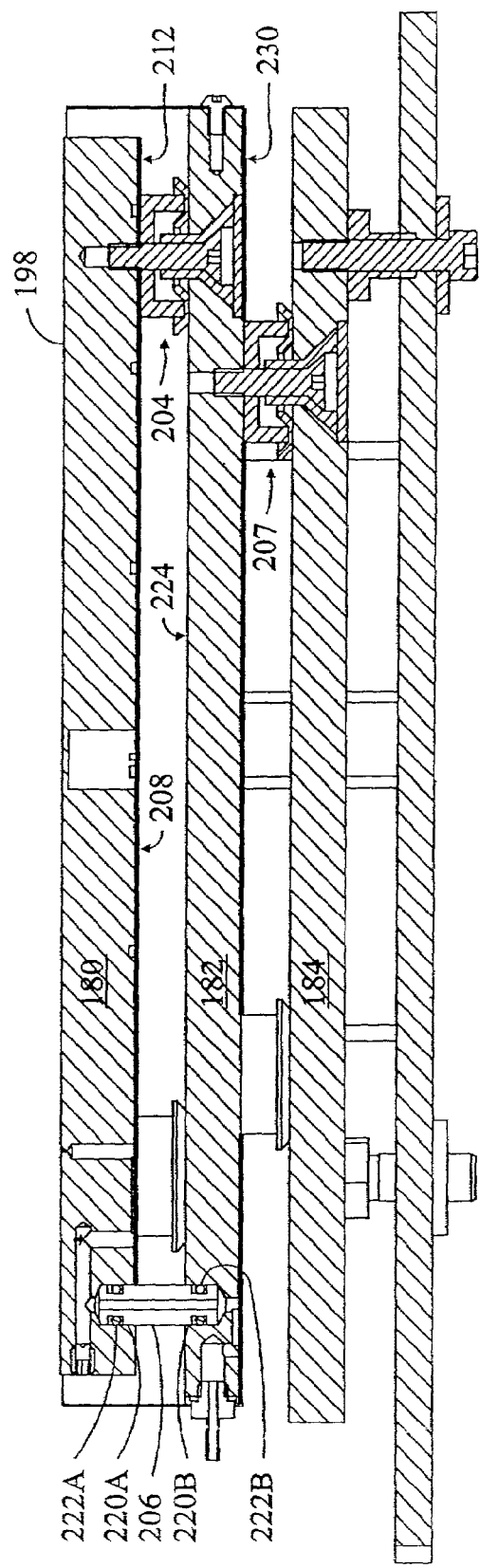
FIG. 11 is a cross sectional view of a multi-layer chuck.

To provide a vacuum path between the middle chuck assembly element and the upper chuck assembly element a vacuum pin 206 interconnects respective vacuum lines and particular vacuum holes (e.g., "zones") on the upper surface of the upper chuck assembly element, as illustrated in FIG. 11. Normally, one vacuum line and one vacuum pin is provided for each "zone." The vacuum pins are preferably recessed into respective openings 220a and 220b in the facing surfaces 208 and 224 of the upper and middle chuck assembly elements. Each vacuum pin includes a pair of O-rings 222a and 222b which provides a seal within respective openings 220a and 220b and likewise permits the vacuum pins 206 to move within the openings. The spacing between the facing surfaces 208 and 224, depth of the openings 220a and 220b, and length of the vacuum pins 206 are preferably selected such that changes in the spacing between the surfaces still permit the vacuum pins 206 some movement within the openings 220a and 220b. Accordingly, the vacuum pins "float" within the openings and do not determine, or otherwise limit, the spacing between the upper and middle chuck assembly elements. Further, the vacuum pins are not rigidly connected to both the upper and middle chuck assembly elements. Alternatively, the vacuum pins may be rigidly connected to one of the upper and middle chuck assembly elements, if desired. The vacuum pins are preferably constructed from a good dielectric material, such as Teflon or PCTFE. Preferably, the vacuum pin(s) are positioned at locations exterior to the pins 200, 201, 204 (e.g., the distance from the center of the chuck to the pins is less than the distance from the center of the chuck to the vacuum pins) to minimize noise. It is to be understood that any non-rigidly interconnected set (one or more) of vacuum paths that do not define the spacing may be provided between a pair of chuck assembly elements.

The pin securing the middle chuck assembly element 182 to the upper chuck assembly element 180 includes a portion thereunder that is open to the lower chuck assembly element, normally connected to shield. More specifically, the pin 204 electrically connected to the upper chuck assembly element 180 provides an unguarded leakage path through the middle chuck assembly element 182 to the lower chuck assembly element 184. In existing designs, a small plate is secured over the opening to provide guarding. A more convenient guarding structure is a lower cover plate 230 over the pin openings, preferably covering a major portion of the middle chuck assembly element 182. The lower cover plate 230 is electrically isolated from the pins. In addition, the plate 230 together with the middle chuck assembly element 182 defines vacuum paths.

Figure 12:
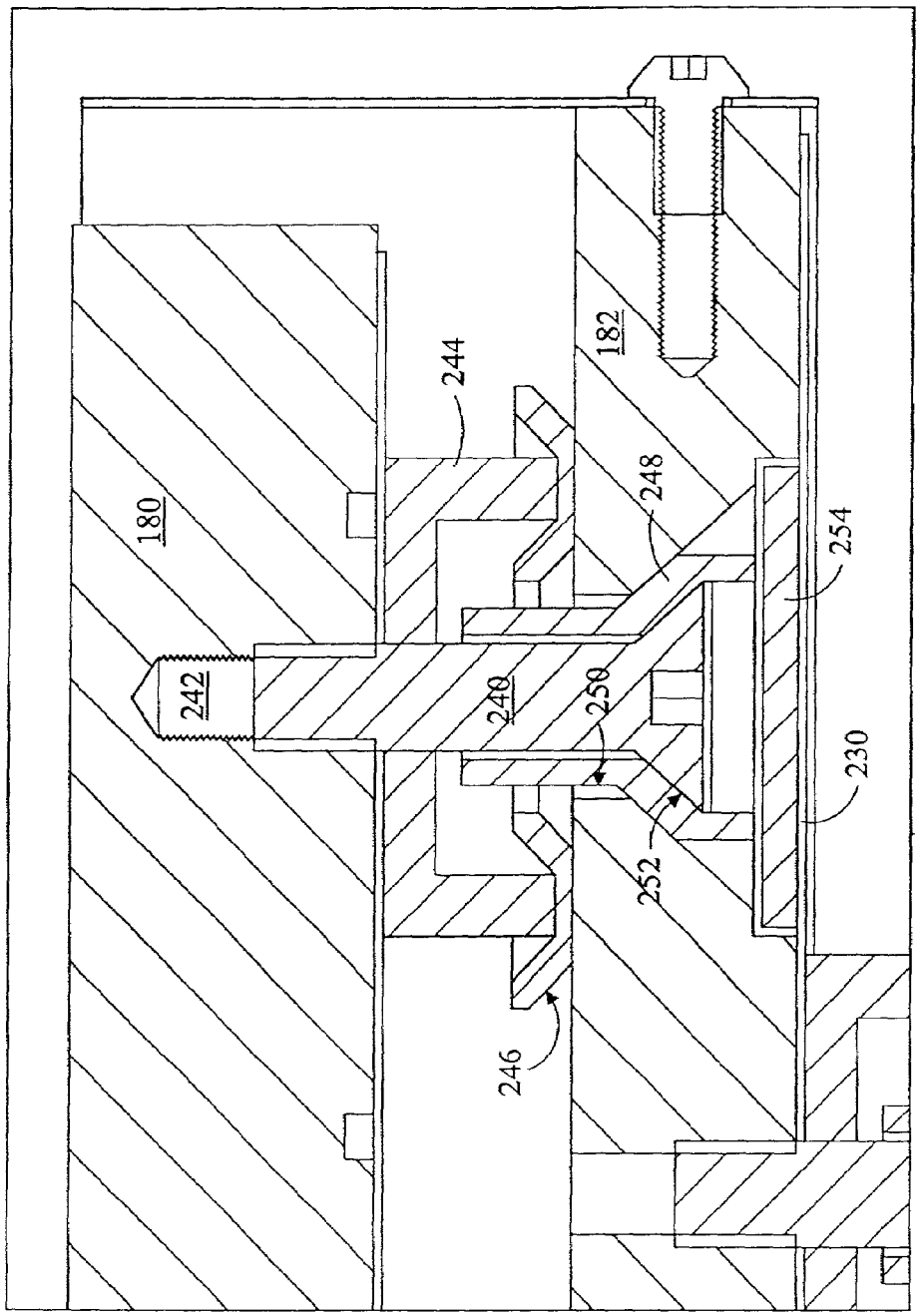
FIG. 12 is an enlarged cross sectional view of the interconnection between a pair of chuck assembly elements of the chuck of FIG. 11.

Referring to FIG. 12, the pin structure provides both mechanical stability and electrical isolation. A threaded screw-240 is inserted through the middle chuck assembly element 182 and threaded into a threaded opening 242 in the lower surface of the upper chuck assembly element 180. A conductive circular generally U-shaped member 244 separates the upper and middle chuck assembly elements and is in pressing engagement with the upper chuck assembly element. The conductive U-shaped member 244 is electrically connected to the screw 240 and extends radially outward from the screw 240. The conductive U-shaped member provides lateral stability of the chuck assembly. An insulating circular generally U-shaped member 246, preferably made from PCTFE, opposes the conductive U-shaped member 244 and is in pressing engagement with the middle chuck assembly element. The insulating circular U-shaped member 246 self-centers to the conductive U-shaped member 244 within the upwardly extending portions thereof. A circular insulating insert 248 surrounds the threaded screw 240 within the opening 250 in the middle chuck assembly element and supports the inclined head portion 252 of the threaded screw 240. In the case that the screw 240 does not have an inclined portion the insulating insert may support the head portion of the screw 240. An insulating cover 254 is preferably placed over the end of the threaded screw 240 and preferably spaced apart therefrom. Over the end of the screw is the cover plate 230, preferably connected to a guard potential. The pin structure may likewise be used, if desired, between other adjacent plates of the chuck assembly.

Figure 13:
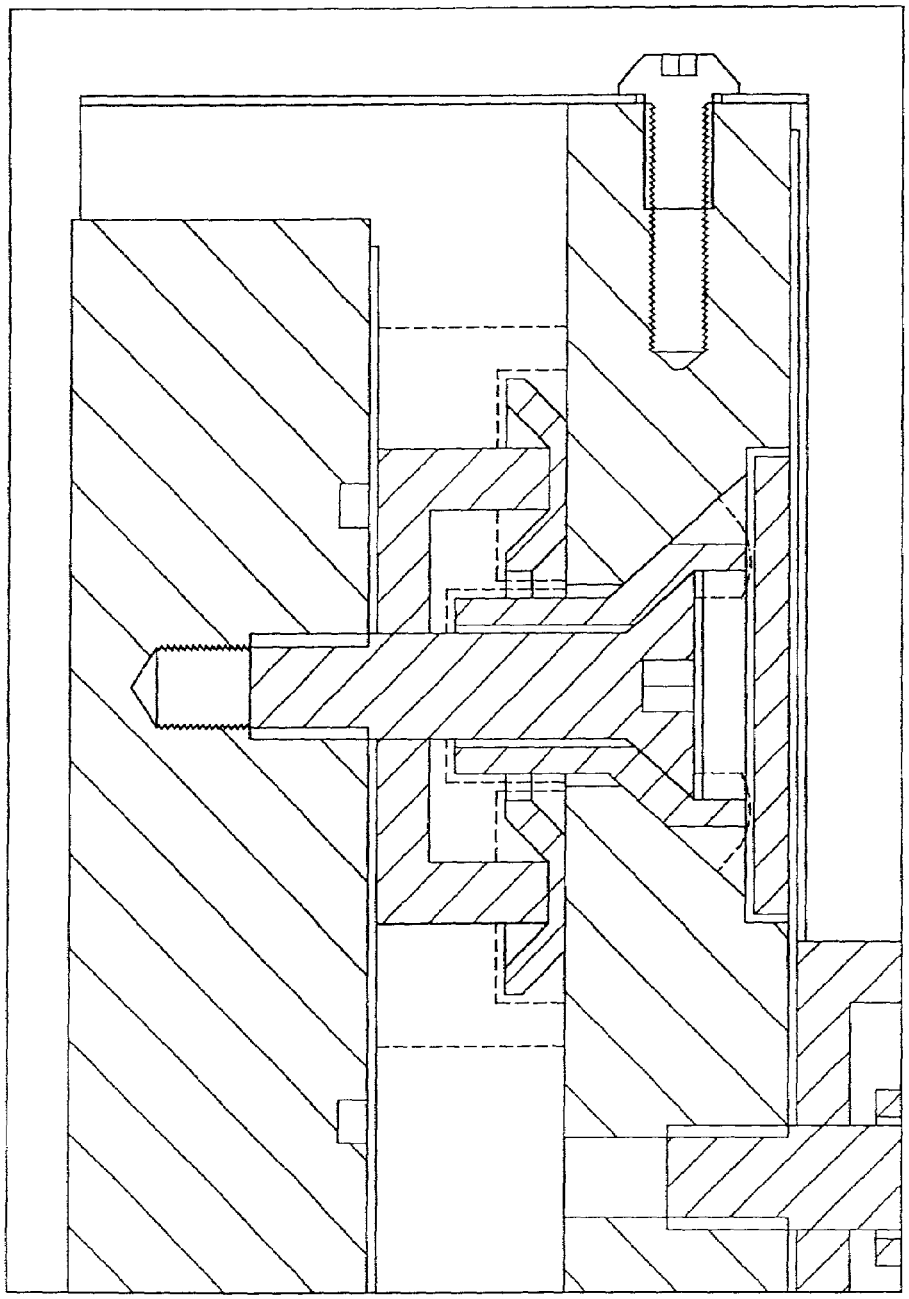
FIG. 13 is an enlarged cross sectional view of the interconnection between a pair of chuck assembly elements of the chuck of FIG. 11 illustrating a minimum air breakdown distance.

While making high voltage measurements the air between two conductors will break down, e.g., arc, if the conductors are sufficiently close together. For example, when testing at 5000 volts the spacing between conductors should be in excess of about 0.2 inches. Referring to FIG. 13 (same as FIG. 12), it may be observed that all of the paths through the air from the screw and conductive circular U-shaped member (signal potential) to another conductor at guard potential is greater than 0.2 inches, as indicated by the "- - - " lines. For example, the fins of the U-shaped insulating member 246 may increases the creepage distance greater than about 0.2 inches.

After further consideration another factor impacting rigidly is the interconnecting materials themselves. Preferably, the conductive member is at least three times as thick as the insulating material between the adjacent chuck assembly elements, and more preferably at least six times as thick. In this manner, a major portion of the spacing material is rigid conductive material which is significantly less prone to compression than the insulating material under pressure.

After extensive testing the present inventor came to the further realization that the dielectric absorption of the dielectric material tends to drain faster when both sides of the dielectric material are in face-to-face contact with electrical conductors. In contrast, when only one side of the dielectric material is in face-to-face contact with an electrical conductor then the dielectric absorption drains slowly with changes in electrical potential and hence degrades the electrical performance. Accordingly, referring to FIG. 12, it may be observed that substantially all (or at least a major portion) of the insulating material in contact with a conductor has an opposing conductor. For example, the upper portion of the center insulating portion is not in contact with the conductive screw because it would be difficult to provide an opposing conductor, and be further complicated if a requisite spacing is necessary.

The terms and expressions which have been employed in the foregoing specification are used therein as terms of description and not of limitation, and there is no intention, in the use of such terms and expressions, of excluding equivalents of the features shown and described or portions thereof, it being recognized that the scope of-the invention is defined and limited only by the claims which follow.

What is claimed is:

1. A chuck for a probe station comprising:
   (a) a first chuck assembly element defining a substantially planar upper surface thereon suitable to support a wafer, said first chuck assembly element defining a substantially planar lower surface;
   (b) another chuck assembly element defining a substantially planar surface; and
   (c) a chuck spacing mechanism having exactly three independent supports interconnecting said first chuck assembly element and said another chuck assembly element defining the spacing between said first chuck assembly element and said another chuck assembly element in such a manner that said substantially planar lower surface of said first chuck assembly element and said substantially planar upper surface of said another chuck assembly element are in opposing relationship with respect to one another.

2. The chuck of claim 1 wherein said chuck spacing mechanism maintain said first chuck assembly element and said another chuck assembly element in a rigid relationship with respect to each other.

3. The chuck of claim 1 wherein each of said supports are substantially equal distant from one another.

4. The chuck of claim 1 wherein each of said supports is free from directly electrically interconnecting said first chuck assembly element and said another chuck assembly element.

5. The chuck of claim 1 wherein said first chuck assembly element is electrically connected to a signal path.

6. The chuck of claim 5 wherein said another chuck assembly element is electrically connected to a guard path.

7. The chuck of claim 1 further comprising:
   (a) said first chuck assembly element having a lower surface, said first chuck assembly element defining at least one first air path therein to said upper surface;
   (b) said another chuck assembly element having an upper surface in opposing relationship to said lower surface of said first chuck assembly element, said second chuck assembly defining at least one second air path therein; and
   (c) an interconnecting member interconnecting said first air path and said second air path in such a manner that a vacuum may be provided from said first air path to said second air path, said interconnecting member movable with respect to at least one of said first chuck assembly element and said second chuck assembly element.

8. The chuck of claim 1 further comprising:
   (a) said first chuck assembly element having a lower surface defining at least one recess therein; and
   (b) a cover plate in overlying relationship to said lower surface of said first chuck assembly element together defining at least a portion of an air path to said upper surface suitable for providing a vacuum to said wafer supported by said upper surface.

9. The chuck of claim 1 comprising:
   (a) a first chuck assembly element having a lower surface, said first chuck assembly element defining at least one first air path therein to said upper surface;
   (b) said another chuck assembly element having an upper surface in opposing relationship to said lower surface of said first chuck assembly element, said second chuck assembly defining at least one second air path therein; and
   (c) an interconnecting member interconnecting said first air path and said second air path in such a manner that a vacuum may be provided from said first air path to said second air path.

10. The chuck of claim 9 wherein said interconnecting member is located closer the periphery of said first chuck assembly element than a nearest member determining, at least in part, the spacing between said first chuck assembly element and said another chuck assembly element.

11. The chuck of claim 1 comprising:
   (a) said first chuck assembly element having a lower surface,
   (b) said another chuck assembly element having an upper surface and a lower surface where the upper surface is in opposing relationship to said lower surface of said first chuck assembly element; and
   (c) a cover plate in overlying relationship to at least a major portion of said lower surface of said another chuck assembly element proximate said chuck spacing mechanism element.

12. The chuck of claim 1 comprising:
   (a) said first chuck assembly element having a lower surface;
   (b) said another chuck assembly element having an upper surface and a lower surface where the upper surface is in opposing relationship to said lower surface of said first chuck assembly element; and
   (c) at least one of said supports including an insulator having a first surface and a second surface surrounding at least a portion of said at least one supports between the upper and lower surfaces of said another chuck assembly element, at least a first portion of a first surface of said insulator in pressing engagement with said another chuck assembly element, at least a second portion of a second surface of said insulator in pressing engagement with said at least one support.

13. The chuck of claim 1 wherein said first portion of said first surface and said second portion of said second surface have an overlapping relationship over at least a major portion of at least one of said first portion and said second portion.

14. The chuck of claim 1 comprising:
   (a) said first chuck assembly element having a lower surface;
   (b) said another chuck assembly element having an upper surface and a lower surface where the upper surface is in opposing relationship to said lower surface of said first chuck assembly element; and
   (c) at least one of said supports including a generally U-shaped insulator having a first surface in pressing engagement with said upper surface of said another chuck assembly element and a second surface in pressing engagement with a first surface of a generally U-shaped conductive spacer, a second surface of said U-shaped conductive spacer in pressing engagement with said lower surface of said first chuck assembly element.

15. The chuck of claim 1 comprising:
   (a) said first chuck assembly element having a lower surface;
   (b) said another chuck assembly element having an upper surface and a lower surface where the upper surface is in opposing relationship to said lower surface of said first chuck assembly element;
   (c) a chuck spacing mechanism interconnecting said first and second chuck assembly elements and defining the spacing between said first and second chuck assembly elements; and
   (d) at least one of said supports including an insulator having a first surface in pressing engagement with said upper surface of said another chuck assembly element and a second surface in pressing engagement with a first surface of a conductive spacer, a second surface of said conductive spacer in pressing engagement with said lower surface of said first chuck assembly element, where said first surface of said insulator in pressing engagement with said upper surface is substantially directly opposing and coextensive with said second surface of said insulator in pressing engagement with said conductive spacer.

16. The chuck of claim 1 further comprising:
   (a) said first chuck assembly element having a lower surface;
   (b) said another chuck assembly element having an upper surface and a lower surface where the upper surface is in opposing relationship to said lower surface of said first chuck assembly element; and
   (c) said chuck spacing mechanism including an insulator having a first surface in pressing engagement with said upper surface of said another chuck assembly element and a second surface in pressing engagement with a first surface of a conductive spacer, a second surface of said conductive spacer in pressing engagement with said lower surface of said first chuck assembly element, where said first surface of said insulator in pressing engagement with said upper surface is less than one third the thickness of said conductive spacer in pressing engagement with said second surface.

17. The chuck of claim 16 further comprising:
   (a) a chuck spacing mechanism interconnecting said first and second chuck assembly elements and defining the spacing between said first and second chuck assembly elements; and
   (b) said chuck spacing mechanism including an insulator having a first surface and a second surface surrounding at least a portion of said chuck spacing mechanism between the upper and lower surfaces of said second chuck assembly element, at least a first portion of a first surface of said insulator in pressing engagement with said second chuck assembly element, at least a second portion of a second surface of said insulator in pressing engagement with said chuck spacing mechanism, where said first portion of said first surface and said second portion of said second surface have an overlapping relationship over at least a major portion of at least one of said first portion and said second portion.

* * * * *

UNITED STATES PATENT AND TRADEMARK OFFICE
CERTIFICATE OF CORRECTION

PATENT NO. : 6,965,226 B2
DATED : November 15, 2005
INVENTOR(S) : John Dunklee

It is certified that error appears in the above-identified patent and that said Letters Patent is hereby corrected as shown below:

<u>Column 4,</u>
Line 39, change "10$b$" to -- 110$b$ --.
Line 41, change "10$a$" to -- 110$a$ --.

<u>Column 5,</u>
Line 8, change "5284A" to -- 4284A --.

Signed and Sealed this

Twenty-eighth Day of March, 2006

JON W. DUDAS
*Director of the United States Patent and Trademark Office*